United States Patent
Moyal

[19]

[11] Patent Number: 6,107,859
[45] Date of Patent: Aug. 22, 2000

[54] LOW POWER BUFFER CIRCUIT AND METHOD FOR GENERATING A COMMON-MODE OUTPUT ABSENT PROCESS-INDUCED MISMATCH ERROR

[75] Inventor: Nathan Y. Moyal, Austin, Tex.

[73] Assignee: Cypress Semiconductor Corp., San Jose, Calif.

[21] Appl. No.: 08/989,707

[22] Filed: Dec. 12, 1997

[51] Int. Cl.[7] .......................... H03F 3/45; H03K 19/0185
[52] U.S. Cl. .......................... 327/355; 327/307; 330/258; 326/82
[58] Field of Search .................................. 327/307, 333, 327/355, 563, 65, 69, 108, 309; 330/258; 326/82, 83, 86

[56] References Cited

U.S. PATENT DOCUMENTS

| | | | |
|---|---|---|---|
| 3,938,055 | 2/1976 | Buhler | 330/258 |
| 4,616,189 | 10/1986 | Pengue, Jr. | 330/258 |
| 4,701,719 | 10/1987 | Nagata | 330/258 |
| 4,904,953 | 2/1990 | McCormack | 330/258 |
| 5,446,400 | 8/1995 | Nogle | 326/64 |
| 5,856,757 | 1/1999 | Eschauzier | 330/258 |
| 5,898,341 | 4/1999 | Miyashita | 330/258 |
| 5,939,904 | 8/1999 | Fetterman et al. | 330/258 |
| 5,969,545 | 10/1999 | Assadian et al. | 327/62 |

*Primary Examiner*—Timothy P. Callahan
*Assistant Examiner*—Terry L. Englund
*Attorney, Agent, or Firm*—Kevin L. Daffer; Conley, Rose & Tayon

[57] ABSTRACT

A buffer circuit or output driver can produce a common-mode output and maintain fully differential input signals to the buffer. The common-mode output is derived by shifting the input voltages to the buffer by a threshold amount, averaging the shifted input voltages through a resistor divider, then again-shifting the resulting voltage to an output node of the buffer. The voltages at which the first and second shifts occur are equal but in opposite direction. Accordingly, the output voltage is at a midscale, average or common-mode voltage of the input voltages applied to the buffer. The output voltage has sufficient swing head room and is well suited for low power applications. The buffer circuit utilizes relatively few transistors and only two major current paths from the power supply to ground. Accordingly, the buffer consumes relatively low amounts of power. All of the critical transistors within the buffer are of the same doping type, concentration and implant profile to assure the upward and downward shifts are substantially equal based on the threshold voltages of the critical transistors.

24 Claims, 4 Drawing Sheets

LOW POWER BUFFER CIRCUIT AND METHOD FOR GENERATING A COMMON-MODE OUTPUT ABSENT PROCESS-INDUCED MISMATCH ERROR

BACKGROUND OF THE INVENTION

1. Field of the Invention

This invention relates to an electronic circuit and, more particularly, to a buffer circuit and/or method which consumes minimal power, provides large swing voltages of a common mode output, and avoids errors on the common mode output arising from processing mismatches of dissimilar type transistors.

2. Description of the Related Art

Buffer circuits (hereinafter "buffers") are generally known as having two important applications. In many instances, buffers are used to temporarily store data, thus allowing them to compensate for differences in the flow of data or differences between the occurrence of events. Buffers can also be used to provide significant drive current to relatively high impedance load. A buffer can therefore be used as an output driver to match differences between loads placed on the input and the output of the buffer or driver. Accordingly, buffers can sometimes be thought of output drivers, and the terms hereinbelow will be interchangeably used.

Buffers can be implemented as part of an integrated circuit. For example, many integrated circuits include a core section and an input/output ("I/O") section. The I/O section may be arranged near the periphery of the integrated circuit to provide additional drive strength to signals forwarded from the integrated circuit to possibly another integrated circuit. In other examples, buffers are used possibly within the core section between subsystems to provide timing and drive strength matching between those subsystems. Regardless of its placement, a buffer can be formed as either a separate discrete element or within various portions of an integrated circuit.

In some instances, an arrangement of buffers can be used to drive an average voltage value upon a load. Referring to FIG. 1, a pair of buffers 10 and 12 are coupled to receive input voltages $V_A$ and $V_B$, respectively. The input voltages are driven by the buffers upon a pair of resistors 14 and 16. The resistors can be of the same resistance value to assure the output voltage $V_{OUT}$ is near an average of the input voltages $V_A$ and $V_B$. Buffers 10 and 12 provide unity gain and sufficient current to drive each of resistors 14 and 16 so that $V_{OUT}$ is representative of a midscale or average voltage value of the input voltages. For example, if $V_A$ is 3.0 volts and $V_B$ is 2.0 volts, then $V_{OUT}$ will be approximately 2.5 volts. The average or midscale voltage is henceforth referred to as the common-mode voltage.

As clock speeds rise beyond, e.g., 100 MHz, the advantages of using differential or complementary signals become obvious. Noise on the complementary signals is less of an issue than if the signals were not complementary since that noise is demonstrated as common-mode noise. For example, if the voltage at $V_{OUT}$ increases, then it can be ascertained that a positive noise spike occurs on both differential signals $V_A$ and $V_B$. That noise can be disregarded if, for example, the complementary signals $V_A$ and $V_B$ are forwarded to a differential amplifier which amplifies a difference in complementary voltages and not a neutral or "common" change or skew.

FIG. 2 illustrates one example by which buffer 10 or buffer 12 can be implemented with metal oxide semiconductor ("MOS") transistors. For example, if the input voltage $V_A$ is placed on transistor 20, then node 22 will be one gate-to-source voltage ("$V_{gs}$") amount below $V_A$, or $V_A - V_{gs}$. By definition, $V_{gs}$ is equal to $V_T + V_{SAT}$, where $V_T$ is the threshold voltage and $V_{SAT}$ is an additional voltage needed to place the transistor in the saturation region. In typical applications, Vgs is essentially equal to $V_T$, especially if the transistor at issue is relatively large and therefore requires minimal $V_{SAT}$ amounts. If $V_{SAT}$ of transistors 20 and 28 are minimal or are the same, then any differences between $V_A \backslash V_B$ and the output voltage at node 30 is due essentially to $V_T$ of those transistors.

The threshold needed to turn on n-channel transistor 20 is henceforth referred to as $V_{TN}$. Assuming transistors 24 and 26 are active with sufficient bias voltage ($N_{BIAS}$ and $P_{BIAS}$) respectively, $V_A - V_{gs}$ (or, for the reasons described above, $V_A - V_{TN}$) at node 22 will turn on transistor 28. Transistor 28, being a p-channel transistor rather than an n-channel transistor, produces a voltage at the output node 30 of buffer 10/12 equal to $V_A - V_{gs(N)} + V_{gs(P)}$. If $V_{SAT}$ of the transistor pairs are matched or are minimal, then the voltage at the output node 30 is proportional to $V_A - V_{TN} + V_{TP}$. Therefore, it is the relative differences in n- and p-channel threshold that present a problem, as will be described below.

A typical MOS process requires the n-channel transistor regions to be processed (i.e., implanted) at a dissimilar time than the p-channel regions. This implies that the n-channel area receives not only a dissimilar type of implant but, more importantly, a dissimilar concentration and doping profile (i.e., implant depth) than p-channel areas. As a natural consequence of process differences, the threshold values of n-channel transistors do not necessarily match the p-channel transistors even though matching is warranted during design. Any mismatch whatsoever may cause the voltage at node 30 to not equal the input voltage ($V_A$ or $V_B$). Accordingly, buffer 10/12 shown in FIG. 2 may not be a desired unity gain buffer since threshold mismatch may skew the output voltage at node 30 either above or below the input amount.

Referring to FIGS. 1 and 2 in combination, any skew whatsoever at the output of buffers 10 and 12 will correspondingly cause the equal valued resistors to skew the common-mode output $V_{OUT}$. Even though it is attempted that $V_{OUT}$ be an average of the input voltages, threshold mismatching within one or both buffers will cause $V_{OUT}$ to be above or below the midscale, average or common-mode voltage value. The problem is compounded when both buffers are skewed the same amount upward or downward, leaving a common-mode value significantly higher or lower than what that value should be.

An attempt to overcome threshold voltage mismatch is shown in the unity buffer arrangement of FIG. 3. By tying one input of buffers 30 and 32 to the respective output forces the buffers to be single-ended opamps and the input voltages $V_A$ and $V_B$ to translate upon resistors 34 and 36. In applications where the differences between input voltages is desired (i.e., high speed applications), then, it would be beneficial to maintain both inputs available to receive input voltages $V_A$ and $V_B$. Differences between those voltages can be monitored and possibly amplified as a natural outcome of the buffer or output driver.

The arrangements of FIGS. 1 and 3 are not only single-ended, but also involve a significant number of transistors and major current-carrying branches. For example, each buffer of FIG. 1, shown in FIG. 2, involves four transistors and two major current branches since the bias transistors are maintained fully on. Thus, the common-mode output produced by the circuit of FIG. 1 involves a total of 8 transistors and four major current branches between the power supply and ground. Similarly, each buffer or opamp 30/32 in FIG. 3 uses approximately 7 transistors and a minimum of 3 major current branches. This, produces a cumulative of 14 transistors and 6 major current branches needed to produce a common-mode output. Furthermore, the operating range of the opamp output is rather limited and the stability of each op-amp is compromised due to its internal feedback.

It would be desirable to produce a unity gain buffer or output driver which is not susceptible to threshold voltage mis-match between transistors of dissimilar types. The improved buffer must also be one which consumes less power than conventional buffers described above and which involves fewer transistors to achieve a higher density, less complex design. Still further, a buffer is needed which can produce fully differential outputs having unity gain from fully differential inputs. It is desirable that the outputs of the improved design have a significantly large output voltage range and therefore be more attuned to low voltage operation. Accordingly, the desired buffer must produce a consistent common-mode output voltage with fully differential inputs and outputs suitable for high speed applications and without the shortcomings described above.

SUMMARY OF THE INVENTION

The problems outlined above are in large part solved by an improved buffer circuit hereof. The present buffer circuit produces a common-mode output which is not susceptible to threshold voltage mismatch. This is due primarily to the buffer circuit using transistors of the same type connected between the input voltage and the common-mode output. Additionally, the input voltages can be complementary or differential voltages which are forwarded through the buffer in unity gain to fully differential output voltages, according to one application. The improved buffer beneficially uses no more than seven transistors and involves only two major current branches. Only one buffer need be used between a pair of input voltages $V_A$ and $V_B$ (e.g., differential pair of input voltages) and a common-mode output voltage $V_{OUT}$.

According to one application, both the absolute magnitude of each input voltage and the differential between the input voltages are monitored and controlled so as to achieve a relatively fixed common-mode value. Any noise translates to the common-mode output and is disregarded relative to the differential signals. Accordingly, the present buffer or driver circuit can be used in a phase-locked loop ("PLL"), a charge pump or an oscillator. The differential voltages applied, for example, to an oscillator for controlling the oscillation frequency can be monitored and controlled from an application which embodies the present buffer and/or driver.

Broadly speaking, the present invention concerns an electronic circuit and, more particularly, a buffer circuit. The buffer circuit (or buffer) includes a pair of input nodes and an output node. A pair of input transistors having gate conductors are coupled to the respective pair of input nodes. A resistor is coupled between an intermediate node and each of the pair of input transistors. A diode-connected transistor is coupled between the intermediate node and the output node. Input voltages upon the input nodes control a conductive path connected between a power supply and the resistor. According to one embodiment, each of the pair of input transistors operates at the same threshold voltage, and a voltage upon the intermediate node is substantially equal to an average of voltages upon the input nodes minus the mutual threshold voltage of the pair of input transistors. A voltage upon the output node is substantially equal to the sum of a voltage upon the intermediate node and a voltage across the diode-connected transistor. The voltage across the diode-connected transistor is substantially equal to the mutual threshold voltage of the pair of input transistors. Accordingly, a threshold voltage of one of the pair of input transistors (the other threshold voltage being the same), and the matching of the diode-connected voltage drop to that threshold voltage assures the voltage on the output node is equal to an average, midscale or common-mode voltage of a pair of input nodes.

According to yet another embodiment, the buffer circuit includes first and second input transistors, each of which include a gate terminal and a source terminal. First and second resistors are coupled to the source terminals of the respective first and second input transistors. A diode-connected transistor is coupled between the first and second resistors and an output node. A voltage across the diode-connected transistor substantially equals a difference between the voltage upon the gate and source terminals of either the first or the second input transistors. Since the first or second input transistors preferably have the same threshold voltage, it makes no difference which input transistor threshold, or gate-to-source voltage, is used to match with the voltage drop across the diode-connected transistor. The output node of the buffer circuit is adapted to produce a midscale voltage minus the difference between the voltage upon the gate and the source terminals and the voltage across the diode-connected transistor. The sum of the voltage across the gate and source terminals and the voltage across the diode-connected transistor cancels one another, leaving the output node at the common-mode value. Preferably, the first input transistor, second input transistor, and the diode-connected transistor are of the same doping type (i.e., either n-channel or p-channel transistors).

The present invention yet further concerns a method for producing a common-mode output from a pair of input voltages. The method includes shifting downward each of the input voltages by a threshold voltage associated with an input transistor adapted to receive one of the pair of input voltages. The downward-shifted input voltages can then be averaged, and the averaged value can be shifted upward by an amount at least equal to that by which the input voltages were shifted downward. The average, downward-shifted input voltage comprises a common-mode voltage reduced by the downward-shifting step. The upward shifting of the averaged downward-shifted input voltages produces the common-mode output. Preferably, the upward shifting is by an amount equal to that by which the input voltages were shifted downward. Alternatively, the upward shifting is by an amount greater than that by which the input voltages were shifted downward.

BRIEF DESCRIPTION OF THE DRAWINGS

Other objects and advantages of the invention will become apparent upon reading the following detailed description and upon reference to the accompanying drawings in which.

Figure 1:
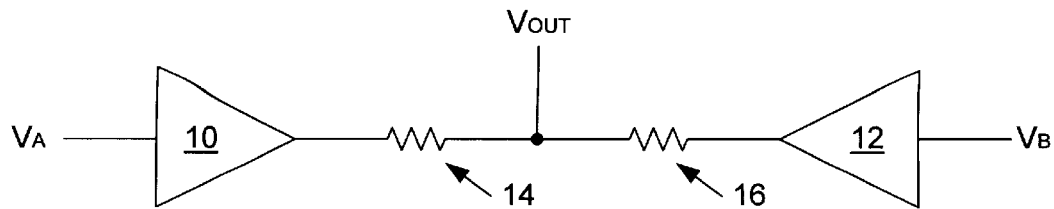
FIG. 1 is a circuit diagram of a pair of buffers coupled, according to one example, to achieve a common mode output voltage from a pair of input voltages.
Figure 2:
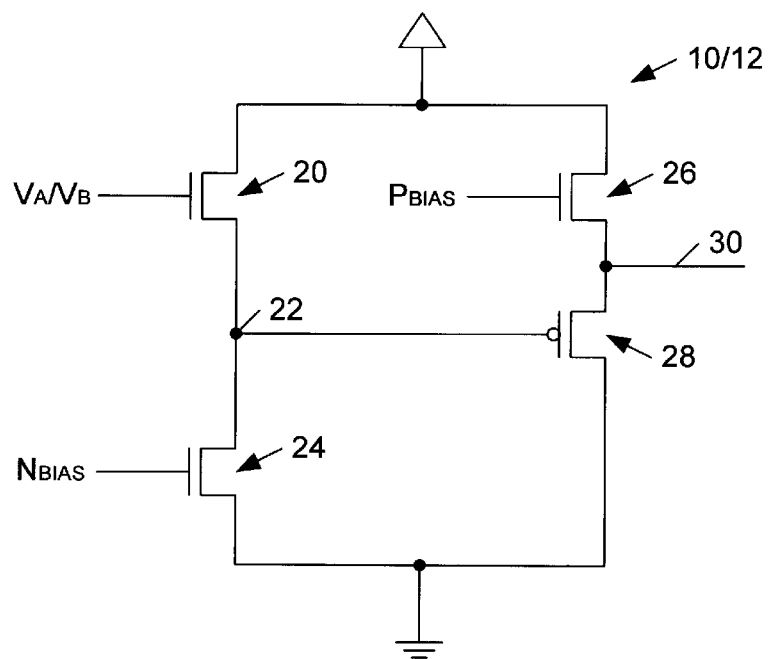
FIG. 2 is an exemplary circuit diagram of possibly one of the pair of buffers in FIG. 1.
Figure 3:
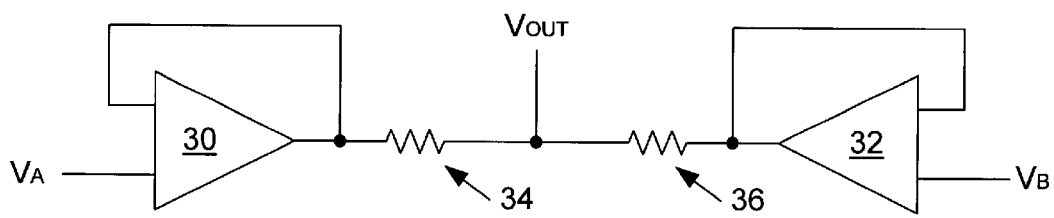
FIG. 3 is a circuit diagram of a pair of buffers coupled in unity gain, according to another example, to achieve a common mode output voltage.

While the invention may be modified and have alternative forms, specific embodiments thereof are shown by way of example in the drawings and will herein be described in detail. It should be understood, however, that the drawings and detailed description thereto are not intended to limit the invention to the particular form disclosed, but on the contrary, the intention is to cover all modifications, equivalents and alternatives falling within the spirit and scope of the present invention as defined by the appended claims.

DETAILED DESCRIPTION OF PREFERRED EMBODIMENTS

Figure 4:
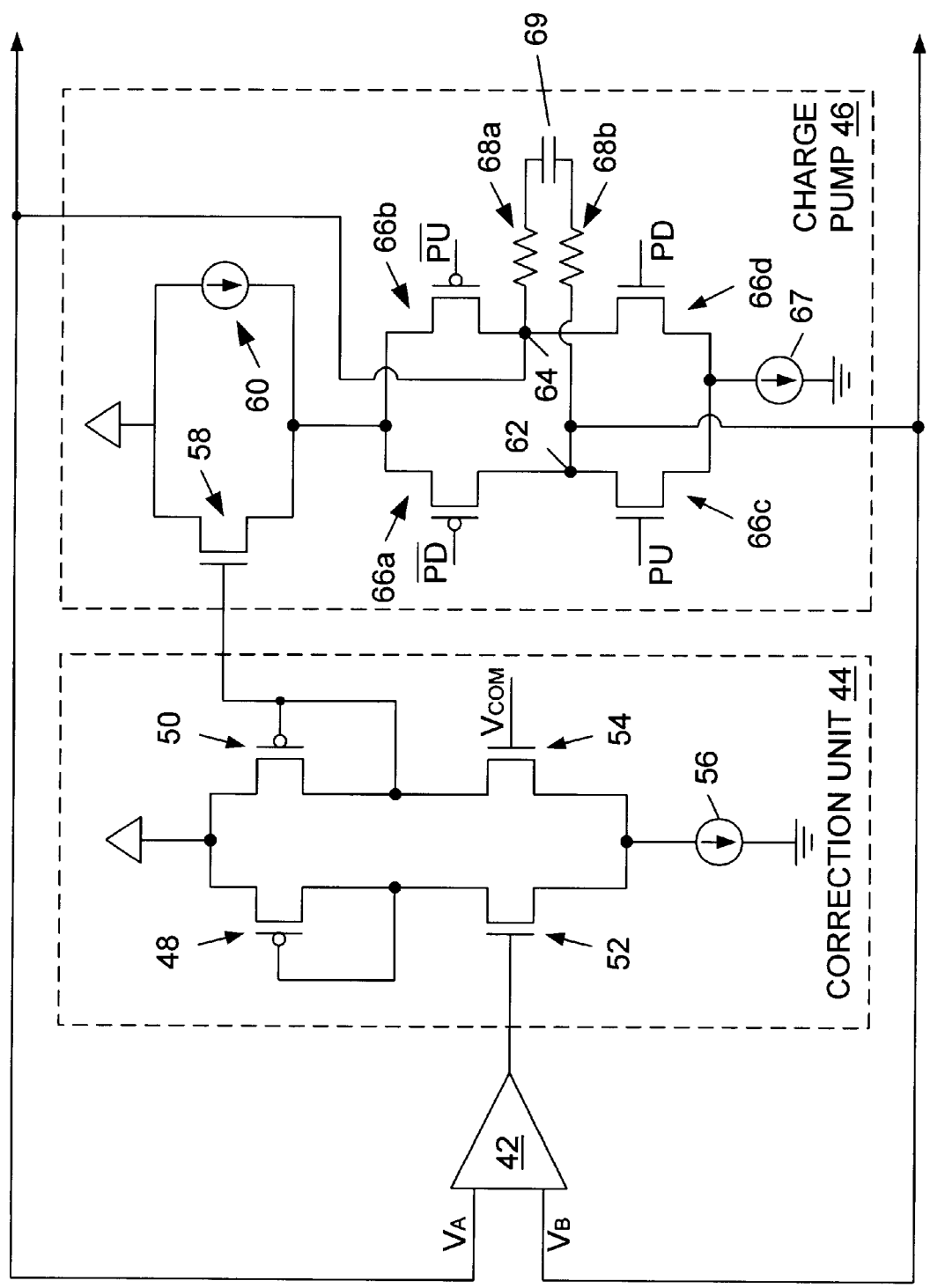
FIG. 4 is a circuit diagram of a buffer shown, according to one application, coupled to a correction unit and a charge pump for controlling the common-mode output from the buffer due to feedback from the charge pump to the buffer.

Turning to FIG. 4, an electronic system 40 is shown incorporating a buffer and/or output driver 42. Circuit 40 may be part of an integrated circuit involving possibly numerous other circuits on a monolithic substrate. Alternatively, circuit 40 can encompass the entire integrated circuit. Input voltages $V_A$ and $V_B$ to buffer 42 can be complementary for differential voltage signals. Associated with circuit 40 is a correction unit 44 and a charge pump 46. The combination of buffer 42, correction unit 44, and charge pump 46 formulates a feedback system which can stabilize the input voltages as differential signals having unity gain from input to output. Most importantly, the output voltages serve not only as input voltages to drive buffer 42, but also to drive any load to which circuit 40 can be connected. That load may have a significantly high input impedance which nonetheless can be driven by a relatively high current output from circuit 40. Correction unit 44 includes a pair of p-channel, diode-coupled transistors 48 and 50. Transistors 48 and 50 are coupled in parallel between a power supply and parallel-coupled, n-channel transistors 52 and 54. Depending on the voltage value produced from buffer 42 relative to a reference voltage ($V_{COM}$), the current through transistor 52 may be less than or greater than that through transistor 54. Currents through transistors 52 and 54 are sourced by a current source 56 coupled to ground.

Merely as an example, reference voltage $V_{COM}$ can be set at 2.5 volts. If the output from buffer 42 exceeds 2.5 volts, then a majority of the current within current source 56 will be forwarded through transistor 52. This will cause a relatively small amount of current to be forwarded through transistors 50 and 54. The current within transistor 50 is mirrored to transistor 58 of charge pump 46. Thus, the relatively small, mirrored current within transistor 58 will contribute, along with current source 60, to pump up or down nodes 62 and 64 depending on the logic state of the pump-up (PU/PU bar) and the pump-down signal (PD/PD bar). Note herein, PU bar is complementary to PU, and PD bar is complementary to PD. At times when the pump up (PU) signal is at a logic high level and pump down (PD) signal is at a logic low, then the voltage at node 64 will increase while the voltage at node 62 will decrease. The converse is true if PU is low and PD is high. Transistors 66a through 66d receive the various PU and PD signals, and resistors 68a and 68b (as well as capacitor 69) receive and somewhat retain the voltage upon nodes 62 and 64. The charge "pumped" to capacitor 69 can then be presented back to buffer 42, as shown.

If, for example, $V_A$ is equal to 2.0 volts and $V_B$ is equal to 1.0, then a common-mode output of buffer 42 will equal 1.5 volts. If the reference common-mode voltage is at 2.5, then transistor 52 will source less current than transistor 54. This allows a greater amount of current through transistor 50. That current will be mirrored through transistor 58 to increase the charge across capacitor 69 depending on the voltage level of PD and PU. When PU and PD are placed in a "charging" voltage state, an increase will occur in $V_A$ or $V_B$, which will eventually achieve a common-mode output from buffer 42 equal to $V_{COM}$ of 2.5 volts.

The feedback from charge pump 46 to buffer 42 insures a stable common mode output from buffer 42 substantially equal to $V_{COM}$. Buffer 42 therefore serves not only to provide a common-mode voltage, but through feedback allows the input voltage $V_A$ and $V_B$ to be forwarded to another circuit or load placed on circuit 40. According to one example, the input voltages can be complementary voltages with a common mode output equal to $V_{COM}$. Thus, FIG. 4 illustrates one application by which common-mode output is desirable from a buffer or driver circuit.

Figure 5:
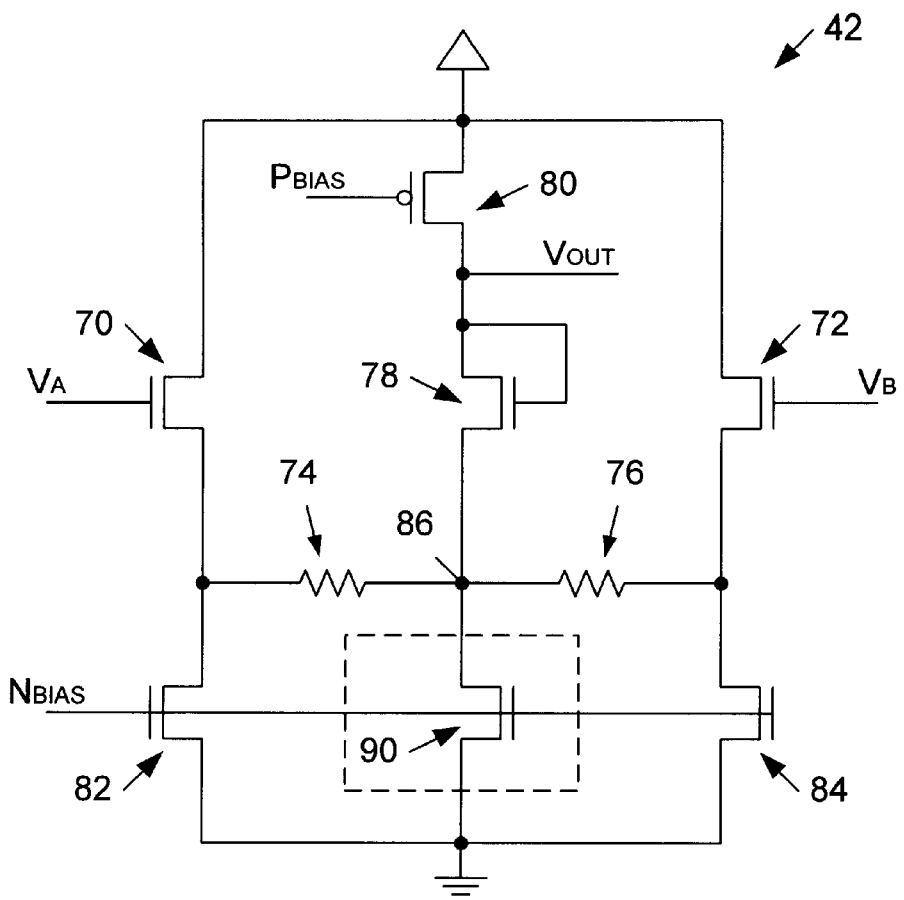
FIG. 5 is a circuit diagram of the buffer possibly shown in FIG. 4, according to one exemplary embodiment.

FIG. 5 illustrates a circuit-level diagram of buffer 42. It is noted that buffer 42 can be used in numerous applications, certainly not limited to that shown in FIG. 4. Specifically, buffer 42 includes a pair of input transistors 70 and 72. A pair of equal-value resistors 74 and 76 are further included. A node between resistor 74 and 76 is deemed an intermediate node 86 to which a diode-connected transistor 78 is connected.

Specifically, the gate and drain terminals of transistor 78 are mutually connected. Preferably, transistors 70, 72 and 78 are of the same dopant type. In the example shown, transistors 70, 72 and 78 are n-channel transistors, each having the same turn-on threshold $V_{TN}$. Since the n-channel transistors are concurrently formed, the dopants used in the channel and junction areas are of identical concentration and are implanted at the same energy. This assures that the threshold voltages of the n-channel transistors are all the same.

Coupled to the mutually connected drain and gate terminals of transistor 78 is an output node $V_{OUT}$. Further coupled to the mutually connected gate and drain is a first bias transistor 80. Unlike the n-channel transistors 70, 72 and 78, bias transistor 80 is a p-channel transistor having a gate terminal connected to a relatively constant reference voltage labeled $P_{BIAS}$. Coupled to input transistors 70 and 72 are second bias transistors 82 and 84. Transistors 82 and 84 are n-channel transistors having a source terminal connected to ground, and a gate terminal mutually connected to a relatively constant reference voltage labeled as $N_{BIAS}$.

Input transistors 70 and 72, as well as second bias transistors 82 and 84, have relatively large gate widths compared to first bias transistor 80 and diode-connected transistor 78. Transistors 82 and 84 can be thought of as source-follower transistors of differential input transistors 70 and 72. The output is coupled to the inputs through a resistor divider network 74 and 76. Carefully matching resistor 74 to resistor 76 ensures intermediate node 86 receives an average, midscale or common-mode voltage of the input voltages reduced by a gate-to-source voltage, essentially a threshold voltage, or an amount proportional to a threshold voltage. It is the threshold voltage, however, that provides the variance of interest and therefore it is the threshold voltage $V_{TN}$ of either n-channel transistor 70 or 72 that essentially establishes the voltage of interest on intermediate node 86. Since the threshold voltages of transistors 70 and 72 are equal, it makes no difference which threshold value the drop represents. Simply, the voltage at intermediate node 86 is a downward-shifted, averaged voltage of the input voltages.

The diode of transistor 78 is arranged such that the p-side of the diode is adjacent node 86 and the n-side is adjacent the output node. This ensures an upward shift by one threshold from the voltage at node 86 to the output node. The upward shift is one threshold shift equal to the downward threshold shift of transistor 70 or 72. Thus, the output voltage will be equal to the average, midscale or common-mode voltage and is not susceptible to threshold mismatch since all the critical transistors 70, 72 and 78 are of the same type.

The voltage at the source of transistor 70 is $V_A-V_{gs}$, whereas the voltage at the source of transistor 72 is $V_B-V_{gs}$. However, since VSAT is minimal or cancels, it is $V_{TN}$ of transistors which are of interest. A voltage upon the intermediate node 86, resulting from the cancellation or minimal $V_{SAT}$ is equal to $[(V_A-V_{TN})+(V_B-V_{TN})]/2$, which reduces to $(V_A+V_B)/2-V_{TN}$. The upward shifted voltage through the diode of transistor 78 is substantially equal to $V_{TN}$. Thus, the addition of $V_{TN}$ to $(V_A+V_B)/2-V_{TN}$ will cause the voltage at the output to be equal to $(V_A+V_B)/2$.

When $V_A$ is equal to $V_B$, the source terminal of transistor 70 and 72 will be one threshold voltage below the input voltage of $V_A$ or $V_B$. The voltage at intermediate node 86 will also be one threshold voltage below the input voltage since no significant current will be passing through resistors 74 and 76. The output voltage will be approximately one threshold voltage above intermediate node 86, yielding a common-mode output. The diode-connected transistor 78 will draw only minimum current which can be supplied by another bias transistor 90 and the first bias transistor 80. Transistors 80 and 90 can be quite small compared to the other transistors. Merely as an example, the input transistors can draw possibly 25.0 microamps, while transistors 80 and 90 can draw a maximum of possibly 5.0 microamps. The current drawn through transistor 78 will not come from the main current sources 82 and 84 but, instead, from minor current sources 80 and 90. According to an alternative embodiment, circuit 42 can forego current source 90. Absent transistor 90, current through diode 78 will come from transistors 82 and 84 which will add a small voltage drop across resistors 74 and 76 from current arising through transistor 78. This will add a small increase in voltage at intermediate node 86 which will translate to the output node. Thus, transistor 90 serves to offset the current provided through transistor 78 to ensure the voltage at the output node is a common-mode voltage and not slightly higher than a common-mode voltage. However, in some applications, a slight increase above the common-mode voltage may be acceptable and therefore transistor 90 can be deleted.

In instances where, for example, input voltage $V_A$ is greater than $V_B$, the source of transistor 70 will accommodate a voltage greater than the source of transistor 72. The intermediate node 86 will average the difference, while transistor 78 will shift that averaged difference by one threshold to yield an average, midscale or common-mode voltage of $(V_A+V_B)/2$. Since $V_A$ is greater than $V_B$, more current will be drawn through transistor 70 than through transistor 72. The current into transistor 70 will be supplied by transistor 82. For example, almost all the, e.g., 25.0 microamps will be supplied, with lesser amount of current supplied from transistor 84 through resistors 74 and 76. The amount of additional current supplied by transistor 84 to transistor 70 (and consequently taken away from transistor 72) is relative to the difference between $V_A$ and $V_B$.

Figure 6:
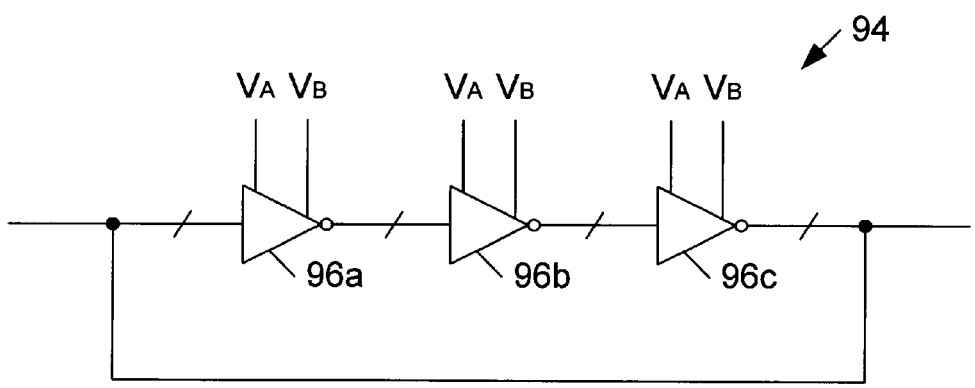
FIG. 6 is a circuit diagram of a series of inverters coupled as an oscillator, wherein the differential of the input voltages about the common mode value derived from the feedback arrangement in FIG. 4 determines the frequency of the oscillator according to another application of the buffer of FIG. 5.

FIG. 6 illustrates one example in which regulated input voltages, sufficing as output voltages, from FIG. 4 can be used. The regulated voltages $V_A$ and $V_B$ are controlled about a common-mode voltage possibly using the circuit shown in FIG. 4. However, differences in $V_A$ and $V_B$ regulate the speed by which the oscillator circuit 94 can transition. If the difference is too large, then the oscillation frequency can be too large. Via feedback (not shown) from the output of the oscillator to the input of the oscillator differences in $V_A$ and $V_B$ can be regulated to ensure an optimal oscillation frequency. Oscillator 94 can be formed in various ways. For example, three inverters 96a, 96b and 96c can be coupled in series to produce an oscillating output. Accordingly, oscillator 94 is but one example by which regulated, fully differential signals $V_A$ and $V_B$, and the common-mode of those signals can be used.

Figure 7:
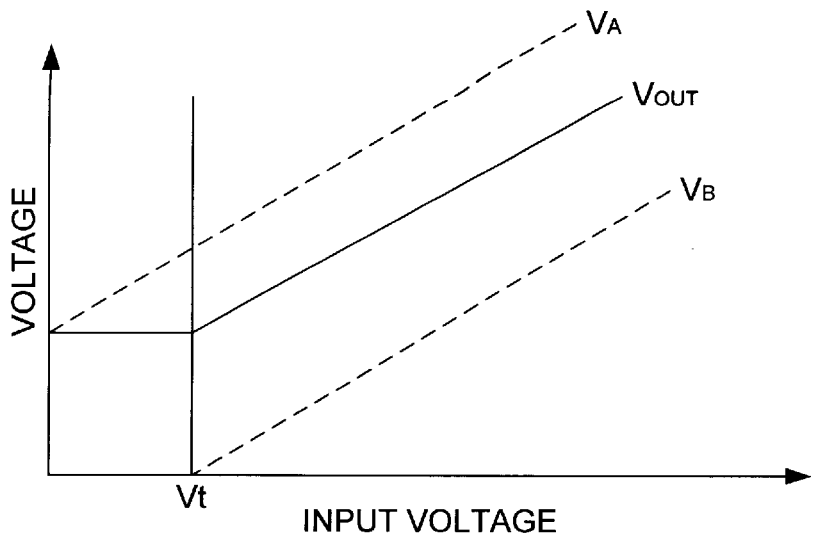
FIG. 7 is a graph of the differential input voltages and common-mode output voltage of the present buffer plotted as a function of the voltages applied to the input terminals.

FIG. 7 illustrates a graph of input voltages $V_A$ and $V_B$. As the input voltages increase above a threshold amount $V_T$, the buffer circuit will begin operation and produce a linearly increasing output voltage as shown. It is noted that the output voltage $V_{OUT}$ tracks increases in the input voltages at a midscale or average between those voltages.

Figure 8:
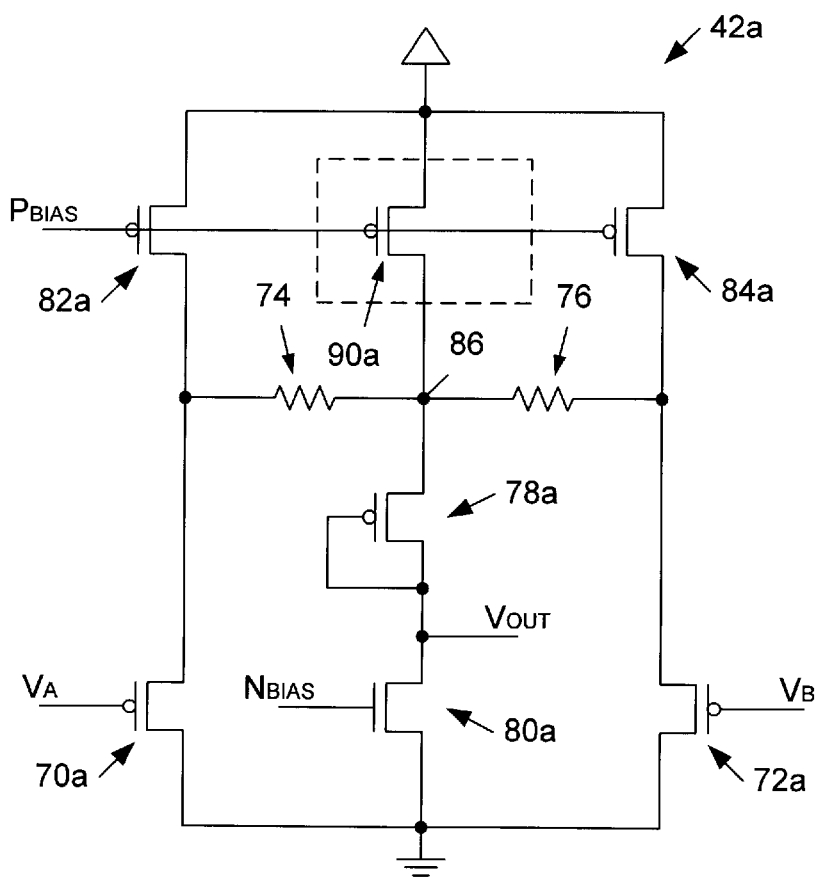
FIG. 8 is a circuit diagram of the buffer possibly shown in FIG. 4, according to another exemplary embodiment.

FIG. 8 illustrates buffer 42a according to an alternative embodiment. Instead of using n-channel transistors for the input transistors and the diode-coupled transistor, FIG. 8 illustrates a circuit with comparable characteristics yet uses p-channel transistors. Specifically, the input transistors 70a and 72a are p-channel transistors, as is the diode-coupled transistor 78a. The second bias transistors 82a, 84a and 90a are also p-channel transistors. Instead of the first bias transistor being a p-channel transistor fed by a $P_{BIAS}$ signal, FIG. 8 illustrates the first bias transistor 80a being an n-channel transistor fed by an $N_{BIAS}$ signal. An intermediate node 86 remains between resistors 74 and 76.

Circuit 42a shown in FIG. 8 operates similar to circuit 42 shown in FIG. 5. However, instead of downward shifting the input voltages and averaging those voltages at an intermediate node which then gets upward-shifted to the output voltage, circuit 42a shown in FIG. 8 upward shifts the input voltages, averages the input voltages, and then downward shifts those averaged, upward-shifted input voltages. The result is still the same: an output voltage being equal to a common-mode voltage whereby the shifted voltage from the input is equal to the again-shifted voltage to the output.

While the invention has been particularly shown and described with reference to preferred embodiments, it will be understood by those skilled in the art that various changes in form and detail may be made with therein without departing from the spirit and scope of the invention.

What is claimed is:

1. A buffer circuit, comprising:
    a pair of input nodes and an output node, wherein voltages applied to the input nodes and a voltage produced upon the output node all differ in the same direction from a voltage upon an intermediate node;

a first conductive path connected from one input node of the pair of input nodes to the output node, wherein the intermediate node is within the first conductive path between the one input node and the output node;

a second conductive path connected from another input node of the pair of input nodes to the output node, wherein the intermediate node is also within the second conductive path between the another input node of the pair of input nodes and the output node;

a pair of input transistors having gate conductors coupled to the respective pair of input nodes, such that one respective input transistor of the pair of input transistors is within each of the first and second conductive paths;

a first resistor coupled within the first or second conductive path between the intermediate node and one transistor of the pair of input transistors; and a diode coupled within the first and second conductive paths between the intermediate node and the output node.

2. The buffer circuit as recited in claim 1, wherein a third conductive path is connected between a power supply and said one input transistor of the pair of input transistors.

3. The buffer circuit as recited in claim 2, further comprising a second resistor coupled between the intermediate node and the other input transistor of the pair of input transistors, wherein a fourth conductive path is connected between the power supply and the other input transistor of the pair of input transistors.

4. The buffer circuit as recited in claim 1, further comprising a first bias transistor coupled to said one input transistor of the pair of input transistors for drawing current from said one input transistor of the pair of input transistors.

5. The buffer circuit as recited in claim 4, further comprising a second bias transistor coupled between a power supply and the output node.

6. The buffer circuit as recited in claim 1, wherein each of the input transistors of the pair of input transistors operates at a similar threshold voltage, and the voltage upon the intermediate node is substantially equal to an average of the voltages upon the input nodes minus the similar threshold voltage of the pair of input transistors.

7. The buffer circuit as recited in claim 6, wherein the voltage produced upon the output node is substantially equal to a sum of the voltage upon the intermediate node and a voltage across the diode, and wherein the voltage across the diode is substantially equal to the similar threshold voltage of the pair of input transistors.

8. The buffer circuit as recited in claim 1, wherein the diode comprises a diode-connected transistor, and the diode-connected transistor, a first input transistor of the pair of input transistors and a second input transistor of the pair of input transistors are all of the same channel type.

9. A buffer circuit, comprising:

first and second input transistors, each of which includes a gate terminal and a source terminal;

first and second resistors of substantially equal resistive value coupled to the source terminals of the respective first and second input transistors, wherein the first and second resistors are coupled together via an intermediate node;

a diode coupled between the intermediate node and an output node, wherein a voltage produced upon the output node and a pair of voltages placed on the gate terminals of the first and second input transistors all differ in the same direction from a voltage upon the intermediate node, and wherein a voltage across the diode substantially equals a difference between the voltages upon the gate terminal and the source terminal of the first or second input transistor; and first and second conductive paths connected from the first and second input transistors, respectively, to the output node, wherein the intermediate node and the diode are within each of the first and second conductive paths, the first resistor is within the first conductive path, and the second resistor is within the second conductive path.

10. The buffer circuit as recited in claim 9, wherein the intermediate node is adapted to produce a midscale voltage between the pair of voltages placed on the gate terminals of the first and second input transistors minus a difference between the voltages upon the gate terminal and the source terminal of the first or second input transistor.

11. The buffer circuit as recited in claim 9, further comprising a bias transistor coupled between the intermediate node and ground.

12. The buffer circuit as recited in claim 10, wherein the output node is adapted to produce the midscale voltage minus the difference between the voltages upon the gate and source terminals plus the voltage across the diode.

13. The buffer circuit as recited in claim 10, wherein the output node is adapted to produce the midscale voltage.

14. The buffer circuit as recited in claim 10, wherein the midscale voltage is an average of the pair of voltages placed on the gate terminals.

15. The buffer circuit as recited in claim 9, further comprising:

a first bias transistor coupled between the diode and a power supply; and a pair of second bias transistors coupled between the respective first and second input transistors and ground.

16. The buffer circuit as recited in claim 9, wherein the diode comprises a diode-connected transistor, and the diode-connected transistor, the first input transistor and the second input transistor are all of the same channel type.

17. A method for producing a common-mode output from a pair of input voltages, comprising:

shifting downward each of the input voltages by an amount of a threshold voltage associated with an input transistor adapted to receive one of the pair of input voltages;

averaging the downward-shifted input voltages; and shifting upward the averaged, downward-shifted input voltages by an amount substantially equal to that by which the input voltages were shifted downward.

18. The method as recited in claim 17, wherein the averaged, downward-shifted input voltages comprises a common-mode voltage reduced by the downward shifting step.

19. The method as recited in claim 17, wherein said upward shifting of the averaged, downward-shifted input voltages produces the common-mode output.

20. A method for producing a common-mode output from a pair of input voltages, comprising:

shifting upward each of the input voltages by an amount of a threshold voltage associated with an input transistor adapted to receive one of the pair of input voltages;

averaging the upward-shifted input voltages; and shifting downward the averaged, upward-shifted input voltages by an amount at least equal to that by which the input voltages were shifted upward.

21. The method as recited in claim 20, wherein the averaged, upward-shifted input voltages comprises a common-mode voltage increased by the upward shifting step.

22. The method as recited in claim 20, wherein said downward shifting of the averaged, upward-shifted input voltages produces the common-mode output.

23. The method as recited in claim 20, wherein said downward shifting is by an amount equal to that by which the input voltages were shifted upward.

24. The method as recited in claim 20, wherein said downward shifting is by an amount greater than that by which the input voltages were shifted upward.

* * * * *